United States Patent
Kelkar et al.

(10) Patent No.: US 6,876,238 B1
(45) Date of Patent: Apr. 5, 2005

(54) CHARGE PUMP

(75) Inventors: Ram Kelkar, South Burlington, VT (US); Anjali R. Malladi, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/707,131

(22) Filed: Nov. 21, 2003

(51) Int. Cl.$^7$ ................................................. H03L 7/06
(52) U.S. Cl. ..................................................... 327/157
(58) Field of Search ................................. 327/147, 148, 327/156, 157, 536

(56) References Cited

U.S. PATENT DOCUMENTS 5,945,855 A * 8/1999 Momtaz ..................... 327/157

* cited by examiner

*Primary Examiner*—Jeffrey Zweizig
(74) *Attorney, Agent, or Firm*—Schmeiser, Olsen & Watts; Richard A. Henkler

(57) ABSTRACT

A structure comprising a charge pump and a charge pump current controller electrically coupled together, and a method for operating the structure. The charge pump comprises a sourcing current control gate on the charge pump's sourcing current path, and a sinking current control gate on the charge pump's sinking current path. The longer the two inputs of the charge pump are at the opposite levels, the more the charge pump current controller causes the sourcing and sinking current control gates to increase the sourcing and sinking currents flowing through the sourcing and sinking current paths, respectively.

20 Claims, 4 Drawing Sheets

CHARGE PUMP

BACKGROUND OF INVENTION

1. Technical Field

The present invention relates to charge pumps, and more specifically, to a charge pump that has its sinking and sourcing currents proportional to the phase difference between its two inputs.

2. Related Art

In general, a conventional charge pump has two inputs and one output. The conventional charge pump is configured such that when its two inputs are out of phase, there is either a sinking current (flowing into the charge pump) or a sourcing current (flowing out of the charge pump) through its output. However, these sinking and sourcing currents in the conventional charge pump do not depend on whether the phase difference between its two inputs is large or small. Assume that the conventional charge pump is electrically coupled to a VCO (Voltage-Controlled Oscillator). It may occur that even when the phase difference between the two inputs of the conventional charge pump is small, the VCO is driven hard causing more jitters in the system.

It is therefore advantageous to implement a charge pump that overcomes the above described problems.

SUMMARY OF INVENTION

The present invention provides a structure comprising (a) charge pump receiving a first charge pump input signal and a second charge pump input signal, the charge pump including a sourcing current path which includes a sourcing current control gate; and (b) a charge pump current controller receiving as inputs the first and second charge pump input signals, wherein the charge pump current, controller is configured to generate a sourcing current control signal to the sourcing current control gate in response to the first and second charge pump input signals being at opposite levels, and wherein the sourcing current control gate is configured to change its current in response to the sourcing current control signal being generated.

The present invention also provides a method for operating a structure. The method comprises the steps of (a) providing in the structure a charge pump receiving a first charge pump input signal and a second charge pump input signal, the charge pump including a sourcing current path which includes a sourcing current control gate; (b) providing in the structure a charge pump current controller receiving as inputs the first and second charge pump input signals; (c) generating, with the charge pump current controller, a sourcing current control signal to the sourcing current control gate in response to the first and second charge pump input signals being at opposite levels; and (d) adjusting the current flowing through the sourcing current control gate in response to the sourcing current control signal being generated.

The present invention also provides a method for operating a charge pump receiving as inputs a first charge pump input signal and a second charge pump input signal, the method comprising the steps of (i) providing a sourcing current control gate on a sourcing current path of the charge pump; and (ii) adjusting the current flowing through the sourcing current control gate in response to the first and second charge pump input signals being at opposite levels.

The present invention provides structures for a charge pump that has sourcing and sinking current proportional to the phase difference (phase error) between its two inputs.

The present invention also provides methods for operating the charge pump.

DETAILED DESCRIPTION

Figure 1:
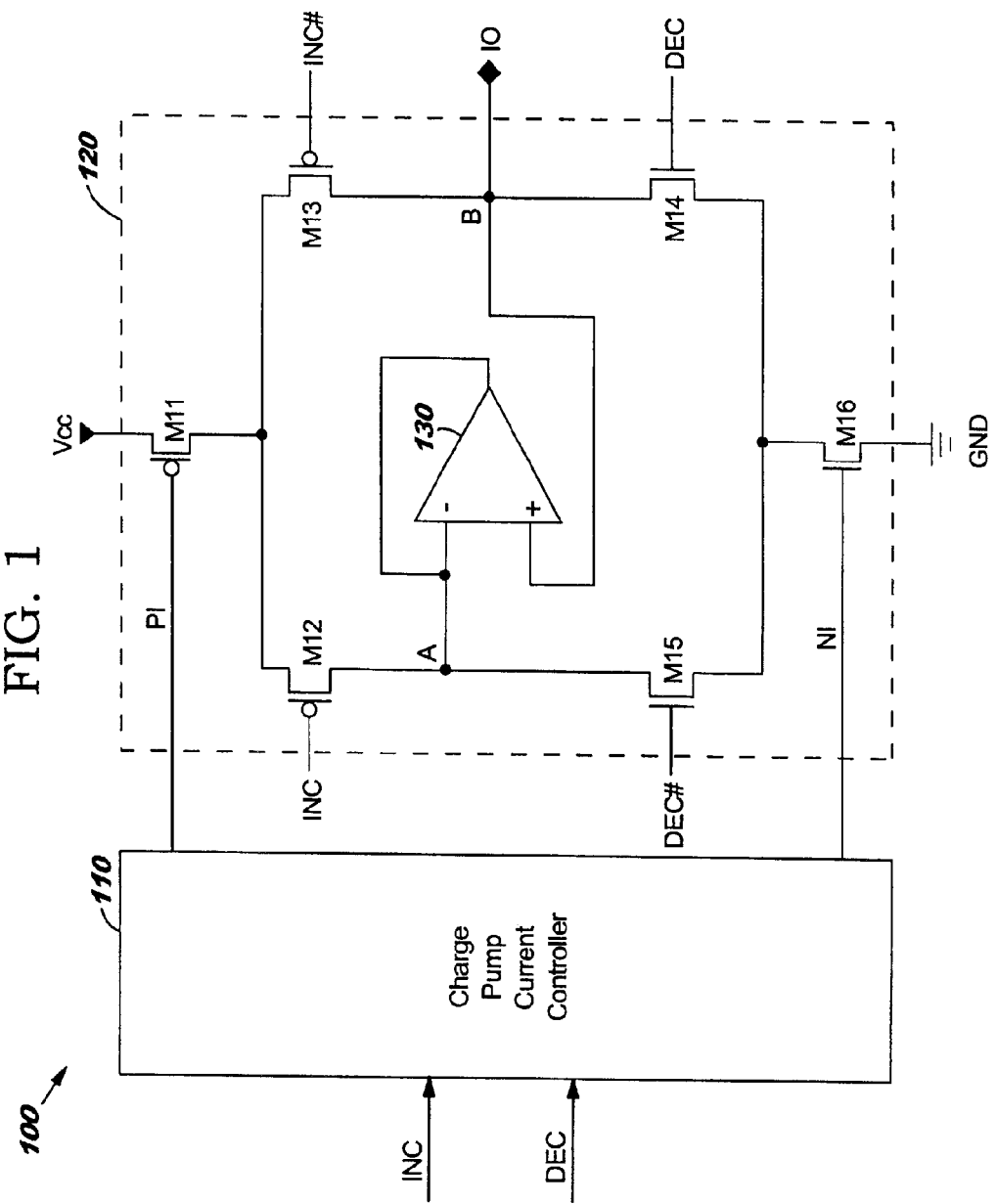
FIG. 1 illustrates a structure comprising a charge pump and a charge pump current controller, in accordance with embodiments of the present invention.

FIG. 1 illustrates a structure 100 comprising a charge pump current controller 110 and a charge pump 120, in accordance with embodiments of the present invention. Illustratively, the charge pump 120 comprises an operational amplifier (op-amp) 130, P-channel transistors M11, M12, and M13, and N-channel transistors M14, M15, and M16.

The transistors M11, M12, M15, and M16 are electrically coupled together in series between VCC and ground. The transistors M11, M13, M14, and M16 are electrically coupled together in series between VCC and ground. In effect, the pair transistors M12 and M15 and the pair transistor M13 and M14 are electrically coupled together in parallel and in series with the transistors M11 and M16 between VCC and ground.

The transistors M12 and M15 have a common node A. Similarly, the transistors M13 and M14 have a common node B. The op-amp 130, in negative feed back configuration, is electrically coupled between node A and node B. As a result, the voltage levels at nodes A and B are always the same, and there is no current flowing between node A and node B via the op-amp 130.

The gate terminal of the transistor M11 receives a signal PI from the charge pump current controller 110. Similarly, the gate terminal of the transistor M16 receives a signal NI from the charge pump current controller 110.

The charge pump 120 receives as inputs two input signals INC and DEC. The signal INC# is the negation (inversion) of the signal INC, and the signal DEC# is the negation of the signal DEC. More specifically, the gate terminals of the transistors M12, M13, M14, and M15 receive the signals INC, INC#, DEC, and DEC#, respectively.

Node B is electrically coupled to a node IO, which is used as the output node of the charge pump 120. The charge pump current controller 110 also receives as inputs the two signals INC and DEC.

As an example of the operation of the structure 100, assume that initially both INC and DEC are at ground (low). With INC being low, transistor M12 is ON (low resistance) and transistor M13 is OFF (high resistance). Similarly, with DEC being low, transistor M14 is OFF and transistor M15 is ON. As a result of both transistors M13 and M14 being OFF, there is no sinking or sourcing current flowing in or out of the charge pump 120 via node IO.

Assume now that INC changes from low to high and DEC stays low. With INC being high, transistor M12 is OFF and transistor M13 is ON. With DEC staying low, transistor M14 is OFF and transistor M15 is ON. As a result, there is a sourcing current flowing from VCC through the transistors M11 and M13 out of the charge pump 120 via node IO. In effect, the transistors M11 and M13 form a sourcing current path in the charge pump 120. It is assumed that a circuit (not shown) is coupled to node IO of the charge pump 120. For instance, a low-pass filter (not shown) can be coupled to node IO.

Figure 5:
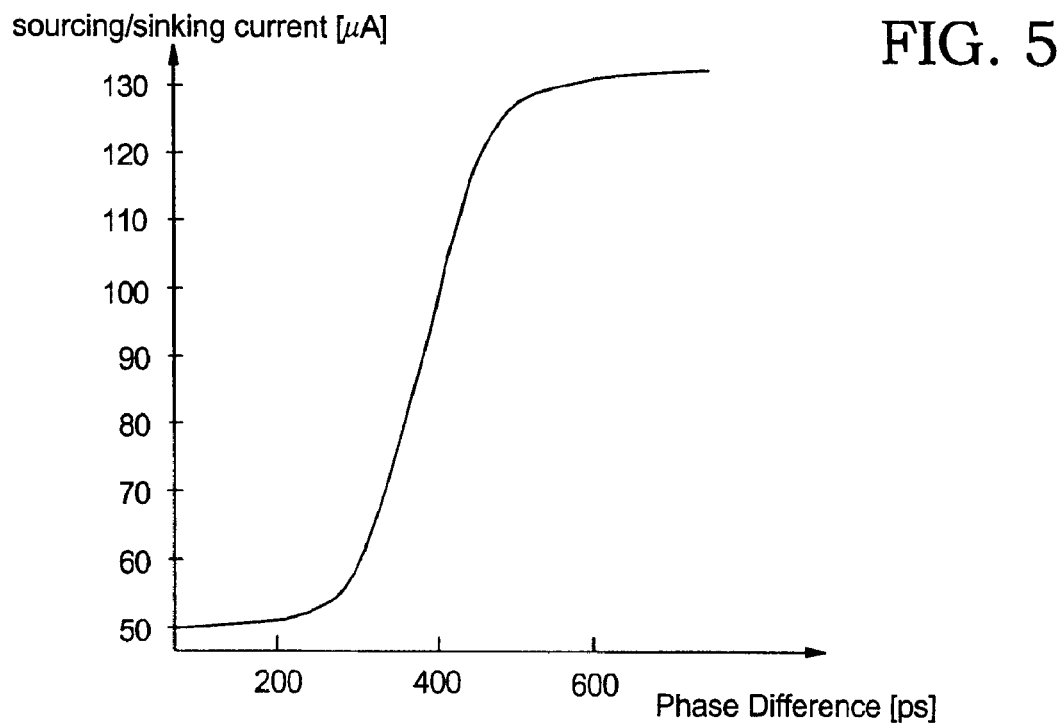
FIG. 5 illustrates a plot of the sourcing/sinking current flowing in or out of the charge pump in FIG. 1 vs. the phase difference between the two inputs of the charge pump of FIG. 1.

In one embodiment, the longer INC stays high and DEC stays low (i.e., the larger the phase difference between INC and DEC becomes), the more strongly the transistor M11 is turned on by the charge pump current controller 110 via the control signal PI. As a result, the sourcing current is proportional to the phase difference between INC and DEC, which are the two inputs of the charge pump 120. This effect is illustrated in FIG. 5. FIG. 5 illustrates a plot of the sourcing/sinking current (flowing in or out of the charge pump 120 via node IO in FIG. 1) measured in micro-Ampere vs. the phase difference between INC and DEC measured in Pico-seconds as a result of a simulation of the charge pump 120 of FIG. 1. As can be seen, the more the phase difference between INC and DEC, the stronger the sourcing or sinking current becomes. Especially, when the phase difference is in the range from 300 ps to 500 ps, the sourcing or sinking current is almost directly proportional to the phase difference between INC and DEC.

Assume now that DEC also changes from low to high while INC stays high. As a result, both transistors M13 and M14 are ON, and both transistors M12 and M15 are OFF. With both transistors M13 and M14 being ON, even if there is some current flowing through the transistors M11 and M16, those currents will flow through transistors M13 and M14 as opposed to flowing in or out of the charge pump 120 via node IO. As a result, there is no sinking or sourcing current flowing in or out of the charge pump 120 via node IO.

Assume now that both INC and DEC change from high to low at the same time. As a result, the transistors M13 and M14 are OFF. Therefore, there is no sinking or sourcing current flowing in or out of the charge pump 120 via node IO.

In one embodiment, for the case in which DEC changes from low to high before INC does, and later both INC and DEC fall to low at the same time, the structure 100 operates in a similar manner, except that there is a sinking current flowing from node IO to ground via the transistors M14 and M16. More specifically, when both INC and DEC are low, there is no sinking or sourcing current flowing in or out of the charge pump 120 via node IO as described above.

When DEC changes from low to high while INC stays low, transistor M13 is OFF, and transistor M14 is ON. As a result, there is a sinking current flowing from node IO to ground via the transistors M14 and M16. In effect, the transistors M14 and M16 form a sinking current path in the charge pump 120. In one embodiment, the longer DEC stays high while INC stays low (i.e., the larger the phase difference between INC and DEC becomes), the more strongly the transistor M16 is turned on by the charge pump current controller 110 via the control signal NI. As a result, the sinking current is proportional to the phase difference between INC and DEC (as illustrated in FIG. 5).

When both INC and DEC later fall to low at the same time, the charge pump 120 goes back to its initial state. As a result, there is no sinking or sourcing current flowing in or out of the charge pump 120 via node IO.

Figure 2:
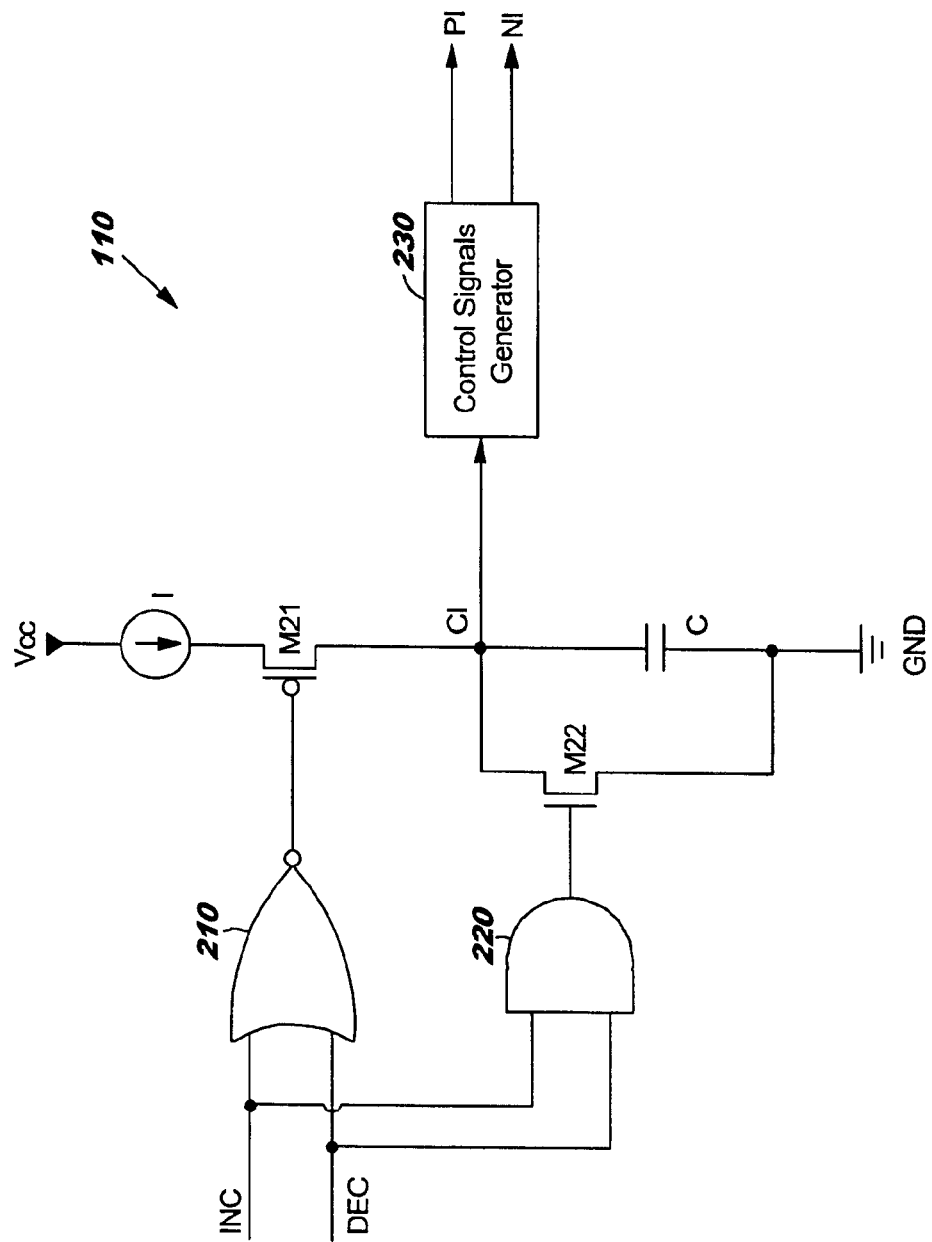
FIG. 2 illustrates the charge pump current controller of FIG. 1, in accordance with embodiments of the present invention. The charge pump current controller comprises a control signals generator, a capacitor, and other components.

FIG. 2 illustrates the charge pump current controller 110 of FIG. 1, in accordance with embodiments of the present invention. Illustratively, the charge pump current controller 110 comprises a NOR gate 210, an AND gate 220, a control signals generator 230, P-channel transistor M21, N-channel transistor M22, a current source I, and a capacitor C.

The NOR gate 210 receives as inputs the signals INC and DEC, and generates an output signal to the gate terminal of the transistor M21. The AND gate 220 receives as inputs the signals INC and DEC, and generates an output signal to the gate terminal of the transistor M22.

The transistors M21 and M22, and the current source I are electrically coupled together in series between VCC and ground. The transistors M21 and M22 have a common node CI. In one embodiment, there is no current flowing in or out of the control signals generator 230 via node CI.

The capacitor C is electrically coupled in parallel with the transistor M22. The control signals generator 230 receives as input a signal on node CI and generates the control signals PI and NI to the transistors M11 and M16 (FIG. 1), respectively.

In the example above, initially when both INC and DEC are low, the outputs of the NOR gate 210 and the AND gate 220 are high and low, respectively. As a result, both the transistors M21 and M22 are OFF. Assume that the capacitor C is fully discharged at this time.

When INC changes from low to high and DEC stays low, the output of the NOR gate 210 is low, and the output of the AND gate 220 is low. As a result, the transistor M21 is ON, and the transistor M22 is OFF. Therefore, the capacitor C is charged up by the current source I, and the voltage level on node CI rises. In response, in one embodiment, the control signals generator 230 pulls PI down and pulls NI up.

Figure 4:
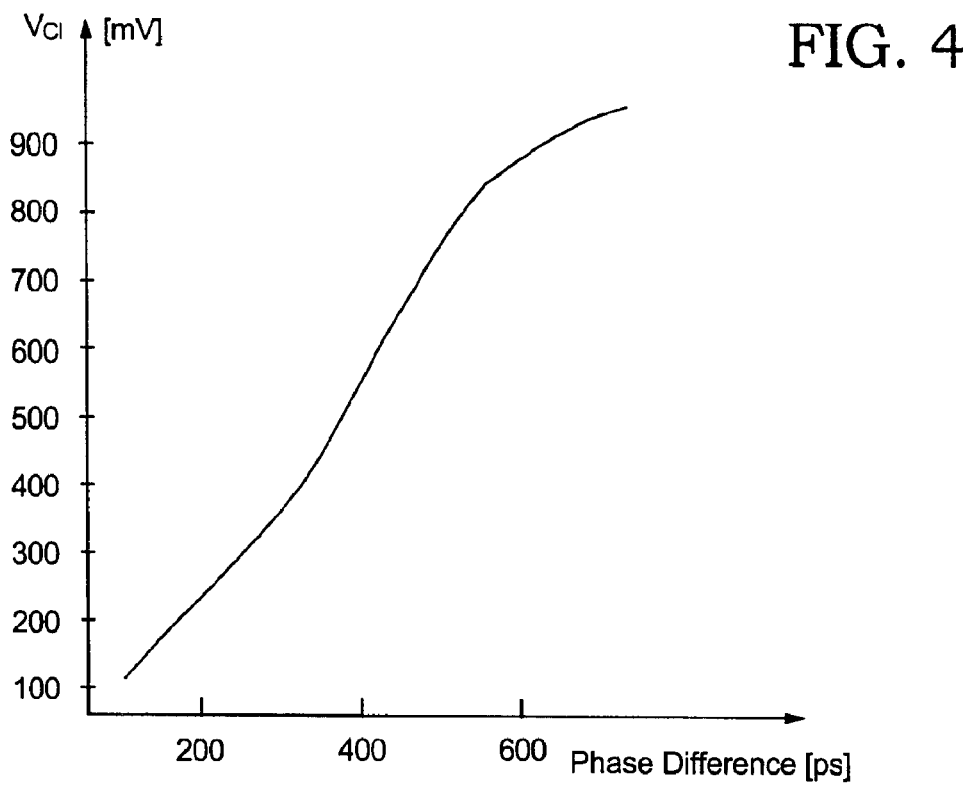
FIG. 4 illustrates a plot of voltage level across the capacitor of FIG. 2 vs. the phase difference between the two inputs of the charge pump of FIG. 1.

In one embodiment, the longer INC stays high and DEC stays low (i.e., the larger the phase difference between INC and DEC becomes), the more the capacitor C is charged up, the higher the voltage $V_{CI}$ across the capacitor C (as illustrated in FIG. 4), and the more the control signals generator 230 pulls PI down and pulls NI up. The more PI is pulled down, the more strongly the transistor M11 (FIG. 1) is turned on, and the stronger the sourcing current (described above) becomes. As a result, the sourcing current is proportional to the phase difference between INC and DEC, as described above with reference to FIG. 1. The effect of the phase difference between INC and DEC on voltage $V_{CI}$ is illustrated in FIG. 4. FIG. 4 illustrates a plot of $V_{CI}$ (the voltage level at node CI in FIG. 2) measured in milivolts vs. the phase difference between INC and DEC measured in pico-seconds as a result of a simulation of the charge pump 120 of FIG. 1. As can be seen, the more the phase difference between INC and DEC, the more $V_{CI}$ rises.

When DEC also changes from low to high while INC stays high, the outputs of the NOR gate 210 and the AND gate 220 are low and high, respectively. As a result, both the transistors M21 and M22 are ON. As a result, the capacitor C discharges through transistor M22, and therefore the voltage level at node CI drops significantly. In response, in one embodiment, the control signals generator 230 pulls PI up and pulls NI down so as to decrease the currents flowing through transistors M11 and M16 (FIG. 1). With both transistors M13 and M14 being ON (described above with reference to FIG. 1), even if there is some currents flowing through the transistors M11 and M16, those currents will flow through transistors M13 and M14 (FIG. 1) as opposed to flowing in or out the charge pump 120 via node IO. As a result, there is no sinking or sourcing current flowing in or out of the charge pump 120 via node IO, as described above with reference to FIG. 1.

When both INC and DEC change from high to low at the same time, the outputs of the NOR gate 210 and the AND gate 220 are high and low, respectively. As a result, both the transistors M21 and M22 are OFF, and the capacitor C stays discharged.

In one embodiment, for the case in which DEC changes from low to high before INC does, the control signals generator 230 operates in a similar manner. More specifically, when DEC changes from low to high and INC stays low, the capacitor C is charged up. In response, the control signals generator 230 pulls PI down and pulls NI up.

In one embodiment, the longer DEC stays high and INC stays low (i.e., the larger the phase difference between INC and DEC becomes), the more the capacitor C is charged up, the higher $V_{CI}$ rises (as illustrated in FIG. 4), and the more the control signals generator 230 pulls PI down and pulls NI up. The more NI is pulled up, the more strongly the transistor M16 (FIG. 1) is turned on, and the stronger the sinking current (described above) becomes. As a result, the sinking current is proportional to the phase difference between INC and DEC, as described above with reference to FIG. 1.

In one embodiment, when INC also changes from low to high while DEC stays high, the capacitor C is discharged, and the voltage level at node CI falls. With both transistors M13 and M14 being ON (described above with reference to FIG. 1), even if there is some current flowing through the transistors M11 and M16, those currents will flow through transistors M13 and M14 (FIG. 1) as opposed to flowing in or out the charge pump 120 via node IO. As a result, there is no sinking or sourcing current flowing in or out of the charge pump 120 via node IO, as described above with reference to FIG. 1.

When both INC and DEC changes from high to low at the same time, the outputs of the NOR gate 210 and the AND gate 220 are high and low, respectively. As a result, both the transistors M21 and M22 are OFF, and the capacitor C stays discharged.

Figure 3:
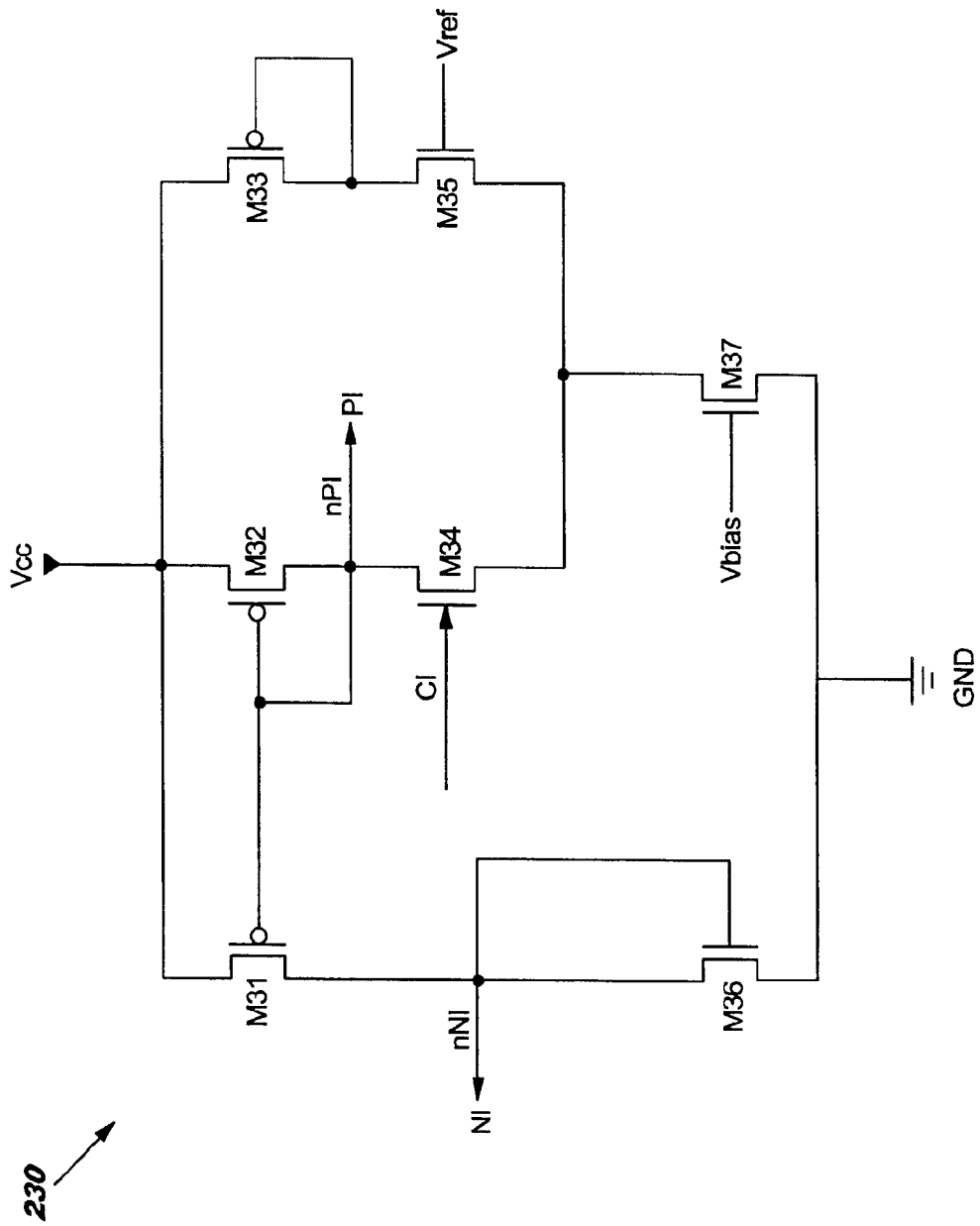
FIG. 3 illustrates the control signals generator of FIG. 2, in accordance with embodiments of the present invention.

FIG. 3 illustrates the control signals generator 230 of FIG. 2, in accordance with embodiments of the present invention. Illustratively, the control signals generator 230 comprises P-channel transistors M31, M32, and M33, and N-channel transistors M34, M35, M36, and M37.

The transistors M31 and M36 are electrically coupled together in series between VCC and ground. The transistors M32, M34, and M37 are electrically coupled together in series between VCC and ground. The transistors M33, M35, and M37 are electrically coupled together in series between VCC and ground. In effect, the pair transistors M32 and M34 and the pair transistors M33 and M35 are electrically coupled together in parallel and in series with the transistor M37 between VCC and ground.

The transistors M32 and M34 have a common node nPI which bears the signal PI. Node nPI and the gate terminals of the transistors M31 and M32 are electrically coupled together. The transistors M31 and M36 have a common node nNI which bears the signal NI. The gate terminal of the transistor M36 is electrically coupled to node nNI. The gate terminal of the transistor M33 is electrically coupled to the common node of the transistors M33 and M35. The gate terminal of the transistor M34 receives the voltage level of node CI of FIG. 2. The gate terminal of the transistor M35 receives a constant reference voltage level Vref. The gate terminal of the transistor M37 receives a constant bias voltage level Vbias.

In effect, the transistors M32, M33, M34, M35, and M37 form a comparator receiving two input signals: the voltage level at node CI and Vref. The comparator generates one output signal PI. The transistors M31 and M36 form a current mirror circuit M31,M36 that holds a current mirroring the current flowing through transistor M32. In other words, if the current flowing through transistor M32 increases or decreases, the current flowing through current mirror circuit M31,M36 also increases or decreases, respectively. Therefore, PI and NI always go opposite directions. More specifically, when the voltage level at node CI increases, the current flowing through transistor M32 increases. As a result, PI is pulled down. With the current flowing through transistor M32 increasing, the current flowing through the current mirror circuit M31,M36 also increases. As a result, NI is pulled up. Similarly, when the voltage level at node CI decreases, PI is pulled up and NI is pulled down.

In the example above, with reference to FIGS. 1–3, initially both INC and DEC are low, and the capacitor C is fully discharged. When INC changes from low to high and DEC stays low, the capacitor C (FIG. 2) is charged up. As a result, the voltage level at node CI rises and, therefore, PI is pulled down and NI is pulled up.

The longer INC stays high and DEC stays low (i.e., the larger the phase difference between INC and DEC becomes), the more the capacitor C (FIG. 2) is charged up, the higher $V_{CI}$ rises (as illustrated in FIG. 4), therefore, the more the transistor M34 (FIG. 3) is turned on, and in response, the more the PI is pulled down.

The more PI is pulled down, the more strongly the transistor M11 (FIG. 1) is turned on, and the stronger the sourcing current (described above) becomes. As a result, the sourcing current is proportional to the phase difference between INC and DEC, as described above with reference to FIG. 1.

When DEC also changes from low to high while INC stays high, the voltage level at node CI is pulled low. As a result, PI is pulled up and NI is pulled down. However, with both transistors M13 and M14 being ON (described above with reference to FIG. 1), even if there is some current flowing through the transistors M11 and M16, those currents will flow through transistors M13 and M14 (FIG. 1) as opposed to flowing in or out the charge pump 120 via node IO. As a result, there is no sinking or sourcing current flowing in or out of the charge pump 120 via node IO, as described above with reference to FIG. 1.

When both INC and DEC change from high to low at the same time, both the transistors M13 and M14 (FIG. 1) are OFF. There is no sinking or sourcing current flowing in or out of the charge pump 120 via node IO, regardless the operation of the charge pump current controller 110, as described above with reference to FIG. 1.

For the case in which DEC rises to high before. INC does, the control signals generator 230 operates in a similar manner. More specifically, initially both INC and DEC are low, and the capacitor C is fully discharged. When DEC changes from low to high and INC stays low, the capacitor C (FIG. 2) is charged up. As a result, the voltage level at node CI rises and, therefore, PI is pulled down and NI is pulled up.

The longer DEC stays high and INC stays low (i.e., the larger the phase difference between INC and DEC becomes), the more the capacitor C (FIG. 2) is charged up, the higher $V_{CI}$ rises (as illustrated in FIG. 4), therefore, the more the transistor M34 (FIG. 3) is turned on, and in response, the more the PI is pulled down, and the more NI is pulled up.

The more NI is pulled up, the more strongly the transistor M16 (FIG. 1) is turned on, and the stronger the sinking current (described above) becomes. As a result, the sinking current is proportional to the phase difference between INC and DEC, as described above with reference to FIG. 1.

When INC also changes from low to high while DEC stays high, the voltage level at node CI is pulled low. As a result, PI is pulled up and NI is pulled down. However, with both transistors M13 and M14 being ON (described above with reference to FIG. 1), even if there is some current flowing through the transistors M11 and M16, those currents will flow through transistors M13 and M14 (FIG. 1) as opposed to flowing in or out the charge pump 120 via node IO. As a result, there is no sinking or sourcing current flowing in or out of the charge pump 120 via node IO, as described above with reference to FIG. 1.

When both INC and DEC change from high to low at the same time, both the transistors M13 and M14 (FIG. 1) are OFF. There is no sinking or sourcing current flowing in or out of the charge pump 120 via node IO, regardless the operation of the charge pump current controller 110, as described above with reference to FIG. 1.

In one embodiment, a sourcing current path circuit (not shown) is electrically coupled in parallel with the transistor M11 (FIG. 1). The sourcing current path circuit can be controlled externally by external control signals; therefore, the current flowing through the sourcing current path circuit does not depend on the phase difference between INC and DEC. The sourcing current path circuit provides a sourcing bias current for the sourcing current described above. The sourcing bias current can have different values depending on the external control signals.

Similarly, a sinking current path circuit (not shown) can be electrically coupled in parallel with the transistor M16 (FIG. 1). The sinking current path circuit can be controlled externally by the external control signals; therefore, the current flowing through the sinking current path circuit does not depend on the phase difference between INC and DEC. The sinking current path circuit provides a sinking bias current for the sinking current described above. The sinking bias current can have different values depending on the external control signals.

In the embodiments described above, the purpose of the NOR gate 210, the AND gate 220, the transistors M21 and M22, the current source I, and the capacitor C (FIG. 2) is to pull the voltage level at node CI from low to high whenever INC and DEC are not at the same level (i.e., when INC is low and DEC is high, or when INC is high and DEC is low). The voltage level at node CI is supposed to reflect the time period during which INC and DEC are not at the same level. More specifically, the longer INC and DEC are at the opposite levels (i.e., low and high), the higher the voltage level at node CI (i.e., $V_{CI}$) rises (as illustrated in FIG. 4). In general, any circuit that can translate the time INC and DEC are not at the same level into voltage level can be used in place of the NOR gate 210, the AND gate 220, the transistors M21 and M22, the current source I, and the capacitor C.

In the embodiments described above, the purpose of the control signals generator 230 FIG. 2) is to pull PI down and pull NI up whenever the voltage level at node CI rises. When the voltage level at node CI falls from high to low, the control signals generator 230 pulls PI up to high and pull NI down to low. FIG. 3 shows only one embodiment of the control signals generator 230 of FIG. 2.

In the embodiments described above, N-channel and P-channel transistors are used. In general, any logic gates can be used to perform the same tasks.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A structure, comprising:
   charge pump receiving a first charge pump input signal and a second charge pump input signal, the charge pump including a sourcing current path which includes a sourcing current control gate; and
   a charge pump current controller receiving as inputs the first and second charge pump input signals,
   wherein the charge pump current controller is configured to generate a sourcing current control signal to the sourcing current control gate in response to the first and second charge pump input signals being at opposite levels, and wherein the sourcing current control gate is configured to change its current in response to the sourcing current control signal being generated.

2. The structure of claim 1, wherein the longer the first and second charge pump input signals are at opposite levels, the higher the current flowing through the sourcing current control gate becomes.

3. The structure of claim 1, wherein the sourcing current control gate is a transistor having a gate terminal receiving the sourcing current control signal.

4. The structure of claim 1, wherein the charge pump further comprises a sinking current path which includes a sinking current control gate, wherein the charge pump current controller is further configured to generate a sinking current control signal to the sinking current control gate in response to the first and second charge pump input signals being at opposite levels, and wherein the sinking current control gate is configured to change its current in response to the sinking current control signal being generated.

5. The structure of claim 4, wherein the longer the first and second charge pump input signals are at opposite levels, the higher the current flowing through the sinking current control gate becomes.

6. The structure of claim 4, wherein the sinking current control gate is a transistor having a gate terminal receiving the sinking current control signal.

7. The structure of claim 1, wherein the charge pump current controller comprises:
   a capacitor;
   a capacitor charging circuit being electrically coupled to the capacitor and receiving as inputs the first and second charge pump input signals; and
   a control signal generator electrically coupled to the capacitor,
   wherein the capacitor charging circuit is configured to charge up the capacitor in response to the first and second charge pump input signals being at opposite levels, and wherein the control signal generator is configured to generate the sourcing current control signal in response to the capacitor being charged up.

8. The structure of claim 7, wherein the control signal generator comprises a comparator including a first comparator input node, a second comparator input node, and a comparator output node, the first comparator input node being electrically coupled to the capacitor, the second comparator input node receiving a reference voltage level, wherein the comparator is configured to generate the sourcing current control signal to the sourcing current control gate via the comparator output node in response to the capacitor being charged up.

9. A method of operating a structure, the method comprising the steps of:

providing in the structure a charge pump receiving a first charge pump input signal and a second charge pump input signal, the charge pump including a sourcing current path which includes a sourcing current control gate;

providing in the structure a charge pump current controller receiving as inputs the first and second charge pump input signals;

generating, with the charge pump current controller, a sourcing current control signal to the sourcing current control gate in response to the first and second charge pump input signals being at opposite levels; and adjusting the current flowing through the sourcing current control gate in response to the sourcing current control signal being generated.

10. The method of claim 9, wherein the longer the first and second charge pump input signals are at opposite levels, the higher the current flowing through the sourcing current control gate is adjusted.

11. The method of claim 9, wherein the sourcing current control gate is a transistor having a gate terminal receiving the sourcing current control signal.

12. The method of claim 9, further comprising the steps of:

providing in the charge pump a sinking current path which includes a sinking current control gate;

generating, with the charge pump current controller, a sinking current control signal to the sinking current control gate in response to the first and second charge pump input signals being at opposite levels; and adjusting the current flowing through the sinking current control gate in response to the sinking current control signal being generated.

13. The method of claim 12, wherein the longer the first and second charge pump input signals are at opposite levels, the higher the current flowing through the sinking current control gate is adjusted.

14. The method of claim 12, wherein sinking current control gate is a transistor having a gate terminal receiving the sinking current control signal.

15. The method of claim 9, further comprising the steps of:

providing in the charge pump current controller (i) a capacitor, (ii) a capacitor charging circuit being electrically coupled to the capacitor and receiving as inputs the first and second charge pump input signals, and (iii) a control signal generator electrically coupled to the capacitor;

charging up the capacitor, with the capacitor charging circuit, in response to the first and second charge pump input signals being at opposite levels; and generating, with the control signal generator, the sourcing current control signal in response to the capacitor being charged up.

16. The method of claim 15, further comprising the steps of:

providing in the control signal generator a comparator including a first comparator input node, a second comparator input node, and a comparator output node, the first comparator input node being electrically coupled to the capacitor, the second comparator input node receiving a reference voltage level; and generating, with the comparator, the sourcing current control signal to the sourcing current control gate via the comparator output node in response to the capacitor being charged up.

17. A method of operating a charge pump receiving as inputs a first charge pump input signal and a second charge pump input signal, the method comprising the steps of:

providing a sourcing current control gate on a sourcing current path of the charge pump; and adjusting the current flowing through the sourcing current control gate in response to the first and second charge pump input signals being at opposite levels.

18. The method of claim 17, wherein the step of adjusting the current flowing through the sourcing current control gate in response to the first and second charge pump input signals being at opposite levels comprises the steps of:

charging up a capacitor in response to the first and second charge pump input signals being at opposite levels;

generating a capacitor signal in response to the capacitor being charged up;

generating, with a comparator, a sourcing current control signal to the sourcing current control gate in response to the capacitor signal being generated; and adjusting the current flowing through the sourcing current control gate in response to the sourcing current control signal being generated.

19. The method of claim 17, further comprising the steps of:

providing a sinking current control gate on a sinking current path of the charge pump; and adjusting the current flowing through the sinking current control gate in response to the first and second charge pump input signals being at opposite levels.

20. The method of claim 19, wherein the step of adjusting the current flowing through the sinking current control gate in response to the first and second charge pump input signals being at opposite levels comprises the steps of:

charging up a capacitor in response to the first and second charge pump input signals being at opposite levels;

generating a capacitor signal in response to the capacitor being charged up;

generating, with a comparator, a sinking current control signal to the sinking current control gate in response to the capacitor signal being generated; and adjusting the current flowing through the sinking current control gate in response to the sinking current control signal being generated.

* * * * *